United States Patent
Wakiyama

(10) Patent No.: US 11,212,923 B2
(45) Date of Patent: Dec. 28, 2021

(54) METHOD FOR PRODUCING RESIN MULTILAYER BOARD

(71) Applicant: Murata Manufacturing Co., Ltd., Nagaokakyo (JP)

(72) Inventor: Jun Wakiyama, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 301 days.

(21) Appl. No.: 16/195,889

(22) Filed: Nov. 20, 2018

(65) Prior Publication Data
US 2019/0090361 A1    Mar. 21, 2019

Related U.S. Application Data

(63) Continuation of application No. PCT/JP2017/016979, filed on Apr. 28, 2017.

(30) Foreign Application Priority Data

Jun. 17, 2016 (JP) .............................. JP2016-120635

(51) Int. Cl.
*H05K 3/46* (2006.01)
*H05K 3/00* (2006.01)
*H05K 3/40* (2006.01)

(52) U.S. Cl.
CPC ......... *H05K 3/4664* (2013.01); *H05K 3/0032* (2013.01); *H05K 3/4038* (2013.01);
(Continued)

(58) Field of Classification Search
CPC .. H05K 3/4664; H05K 3/0032; H05K 3/4038; H05K 3/4647; H05K 2203/107;
(Continued)

(56) References Cited

U.S. PATENT DOCUMENTS

5,329,695 A * 7/1994 Traskos ............... H05K 3/4617
156/89.17
5,611,129 A * 3/1997 Yoshimoto ............... H03H 3/02
29/25.35
(Continued)

FOREIGN PATENT DOCUMENTS

JP   63-307750 A   12/1988
JP   2000-138422 A   5/2000
(Continued)

OTHER PUBLICATIONS

Official Communication issued in International Patent Application No. PCT/JP2017/016979, dated Aug. 1, 2017.

*Primary Examiner* — Peter Dungba Vo
*Assistant Examiner* — Kaying Kue
(74) *Attorney, Agent, or Firm* — Keating & Bennett, LLP

(57) ABSTRACT

A method for producing a resin multilayer board includes preparing a first resin layer including one or more conductor patterns that are disposed thereon and a conductor pattern including a first region that is to be connected to a conductor via; forming a paint layer by applying a paste including a LCP powder to a second region entirely covering the one or more conductor patterns; forming a cavity in the paint layer such that at least the first region is exposed, by performing laser processing; stacking a second resin layer including the conductor via on the first resin layer; and obtaining a resin multilayer board including a layer obtained by curing the paint layer, by applying pressure and heat to the multilayer body to perform thermal pressure-bonding.

8 Claims, 7 Drawing Sheets

(52) U.S. Cl.
CPC ......... *H05K 3/4617* (2013.01); *H05K 3/4647* (2013.01); *H05K 3/4632* (2013.01); *H05K 2201/0141* (2013.01); *H05K 2203/068* (2013.01); *H05K 2203/107* (2013.01)

(58) Field of Classification Search
CPC ........... H05K 2203/068; H05K 3/4617; H05K 3/4632; H05K 2201/0141; Y10T 29/49165; Y10T 29/4916; Y10T 29/49124
USPC .......... 29/852, 849, 846, 829, 848, 830, 831
See application file for complete search history.

(56) References Cited

U.S. PATENT DOCUMENTS

| | | | | |
|---|---|---|---|---|
| 6,687,985 | B2* | 2/2004 | Sakamoto | H01L 23/13 174/250 |
| 6,931,723 | B1* | 8/2005 | Powell | H01L 21/486 29/830 |
| 7,514,637 | B1* | 4/2009 | En | C25D 3/38 174/256 |
| 7,987,589 | B2* | 8/2011 | Huang | H05K 3/4644 29/846 |
| 2003/0180510 | A1* | 9/2003 | Ogawa | H05K 3/041 428/209 |
| 2004/0009683 | A1* | 1/2004 | Hiraoka | H01L 21/568 439/75 |
| 2004/0040651 | A1 | 3/2004 | Tsugaru et al. | |
| 2009/0294156 | A1* | 12/2009 | Ueno | H01L 23/49838 174/255 |
| 2010/0175917 | A1* | 7/2010 | Miyasaka | H05K 3/4682 174/266 |
| 2012/0018194 | A1* | 1/2012 | Maeda | H05K 3/0035 174/251 |
| 2015/0294754 | A1 | 10/2015 | Ohata | |
| 2015/0305150 | A1 | 10/2015 | Ohata | |
| 2016/0295707 | A1* | 10/2016 | Takano | H05K 1/092 |

FOREIGN PATENT DOCUMENTS

| | | | |
|---|---|---|---|
| JP | 2004-111942 A | 4/2004 | |
| JP | 2005-045191 A | 2/2005 | |
| JP | 2009-188146 A | 8/2009 | |
| JP | 2015061058 A * | 3/2015 | ............. H05K 1/092 |
| WO | 2014/109139 A1 | 7/2014 | |
| WO | 2014/188830 A1 | 11/2014 | |

\* cited by examiner

METHOD FOR PRODUCING RESIN MULTILAYER BOARD

CROSS REFERENCE TO RELATED APPLICATIONS

This application claims the benefit of priority to Japanese Patent Application No. 2016-120635 filed on Jun. 17, 2016 and is a Continuation Application of PCT Application No. PCT/JP2017/016979 filed on Apr. 28, 2017. The entire contents of each application are hereby incorporated herein by reference.

BACKGROUND OF THE INVENTION

1. Field of the Invention

The present invention relates to a method for producing a resin multilayer board.

2. Description of the Related Art

International Publication No. WO2014/109139 describes an example of a method for producing a resin multilayer board. In International Publication No. WO2014/109139, in stacking a plurality of resin layers having conductor patterns formed thereon and thermally pressure-bonding the resin layers, a paint layer is provided in a region in which a thickness is insufficient, by a paint containing liquid crystal polymer resin powder, whereby the insufficiency in thickness is eliminated and a flat resin multilayer board is obtained.

In some cases, electrical connection is made between different resin layers among the plurality of stacked resin layers, by using a conductor via or the like. At a location at which such electrical connection is desired to be made, it is necessary to form a pattern of a paint layer such that the paint layer is opened at a connection portion. To provide a cavity in the paint layer, screen printing is conceivable. However, with screen printing, in consideration of the mesh size of a screen plate, printing haziness, blur, or the like, it is necessary to make a printing opening diameter larger than the diameter of a conductor via by a sufficient margin. As a result, a problem arises that a region that is not covered with the paint layer, that is, a region at which it is not possible to eliminate insufficiency in thickness, increases in size near the conductor via.

In order for the paint layer to retain a pattern shape, it is necessary to use a dispersion medium having a high viscosity to disperse the liquid crystal polymer resin powder. To be a dispersion medium having a high viscosity, a dispersion medium having a high boiling point must be used. When the boiling point of the dispersion medium is high, the drying temperature becomes high, so that damage to a base material or the like during high-temperature drying is increased.

When the particle diameter of the material powder contained in the paint layer is larger than the interval between patterns to be formed on the paint layer (a pattern pitch), a problem arises that it is impossible to perform patterning by printing. When powder of a liquid crystal polymer (LCP) is used as an example of the material of a paint for the paint layer, the particle diameter of the powder to be used needs to be smaller than the pattern pitch. However, it is difficult to make LCP into fine powder, and the cost is significantly increased when fine powder is obtained.

For these reasons, formation of an appropriate cavity in the paint layer only by screen printing is difficult in some cases.

SUMMARY OF THE INVENTION

Preferred embodiments of the present invention provide methods for producing resin multilayer boards, in which a pattern of a paint layer is formed so as to be opened with an appropriate size at a location at which inter-layer electrical connection is desired to be made, such that insufficiency in thickness is eliminated and it is possible to obtain flat resin multilayer boards.

A method for producing a resin multilayer board according to a preferred embodiment of the present invention includes a step of preparing a first resin layer that includes a liquid crystal polymer as a main material, a main surface, and one or more conductor patterns disposed on the main surface, the one or more conductor patterns including a conductor pattern that includes a first region that is to be connected to a conductor via; a step of forming a paint layer by applying a paste including liquid crystal polymer powder to a second region entirely or substantially entirely covering the one or more conductor patterns on the main surface; a step of forming a cavity in the paint layer such that at least the first region of the one or more conductor patterns is exposed, by performing laser processing on the paint layer; a step of stacking a second resin layer including the conductor via, on the first resin layer after the step of forming the cavity, such that the conductor via overlaps the first region; and a thermal pressure-bonding step of connecting the conductor via and the conductor pattern in the first region and obtaining a resin multilayer board including a layer obtained by curing the paint layer, by applying pressure and heat to a multilayer body including a stack of the second resin layer stacked on the first resin layer to perform thermal pressure-bonding.

According to the method described above, after a paint layer is formed in a wide region, a cavity for inter-layer connection is formed in the paint layer. Thus, high accuracy is not necessary when forming the paint layer. In addition, since the cavity is formed by laser processing, it is possible to accurately form the cavity having a small diameter. Therefore, it is possible to form a pattern on the paint layer such that a cavity is formed at a location at which inter-layer electrical connection is desired, and insufficiency in thickness is eliminated, so that it is possible to obtain a flat resin multilayer board.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
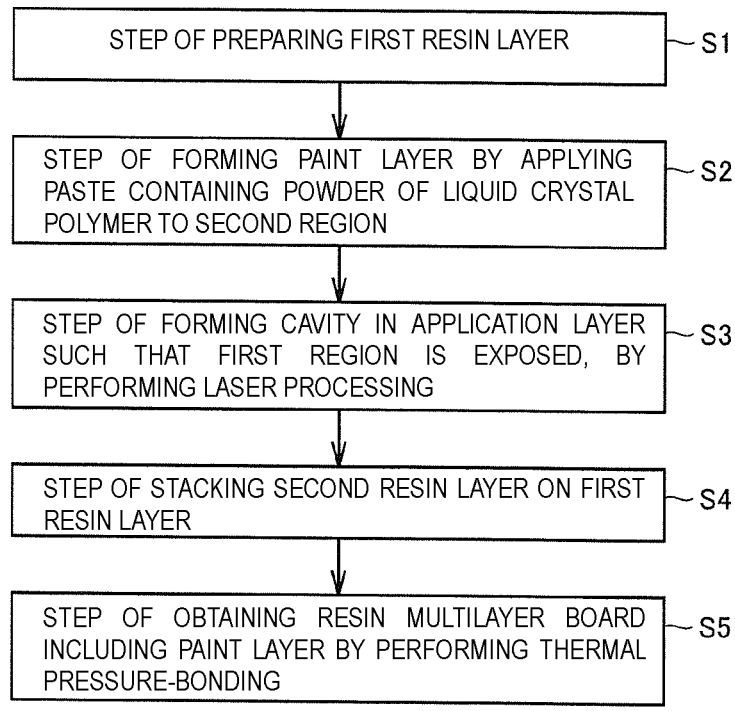
FIG. 1 is a flowchart of a method for producing a resin multilayer board according to a preferred embodiment of the present invention.

Preferred embodiments of the present invention will be described below with reference to the drawings.

Dimensional ratios shown in the drawings do not necessarily represent actual ratios, and may be exaggerated for the convenience of explanation. In the following description, in referring the concept of upper or lower, upper or lower does not necessarily mean absolute upper or lower, and may refer to relative upper or lower in the illustrated attitude.

Methods for producing resin multilayer boards according to preferred embodiments of the present invention will be described with reference to FIG. 1 to FIG. 13. FIG. 1 shows a flowchart of the method for producing the resin multilayer board according to the present preferred embodiment.

The method for producing the resin multilayer board includes a step S1 of preparing a first resin layer that includes a liquid crystal polymer as a main material, a main surface, and one or more conductor patterns disposed on the main surface, the one or more conductor patterns including a conductor pattern including a first region that is to be connected to a conductor via; a step S2 of forming a paint layer by applying a paste including liquid crystal polymer powder to a second region entirely covering the one or more conductor patterns on the main surface; a step S3 of forming a cavity in the paint layer such that at least the first region of the one or more conductor patterns is exposed, by performing laser processing on the paint layer; a step S4 of stacking a second resin layer including the conductor via, on the first resin layer after the step of forming the cavity, such that the conductor via overlaps the first region; and a thermal pressure-bonding step S5 of connecting the conductor via and the conductor pattern in the first region and obtaining a resin multilayer board including a layer obtained by curing the paint layer, by applying pressure and heat to a multilayer body including a stack of the second resin layer stacked on the first resin layer to perform thermal pressure-bonding.

Hereinafter, each step will be described in detail.

Figure 2:
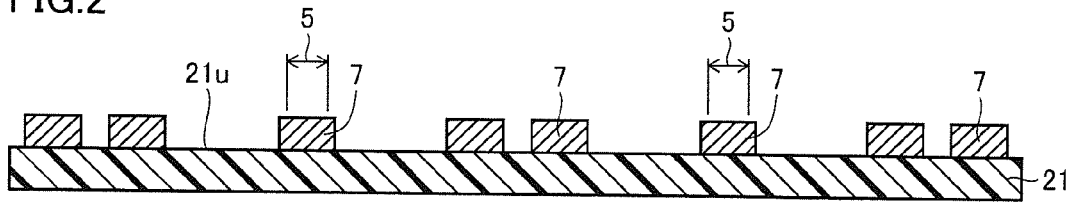
FIG. 2 illustrates a first step of a method for producing a resin multilayer board according to a preferred embodiment of the present invention.

First, as the step S1, a first resin layer 21 is prepared as shown in FIG. 2. The first resin layer 21 includes a liquid crystal polymer as a main material. The first resin layer 21 includes a main surface 21u. One or more conductor patterns 7 are provided on the main surface 21u. Here, the one or more conductor patterns 7 include conductor patterns 7 including first regions 5 that are to be connected to conductor vias. Not necessarily all of the conductor patterns 7 include a first region 5. Some of the conductor patterns 7 may not include a first region 5. In FIG. 2, all of the conductor patterns 7 are shown as having the same or substantially the same size, but are shown merely as an example, and all of the conductor patterns provided on the main surface 21u need not have the same or substantially the same size. A plurality of conductor patterns having different sizes may be provided on the main surface 21u.

Figure 3:
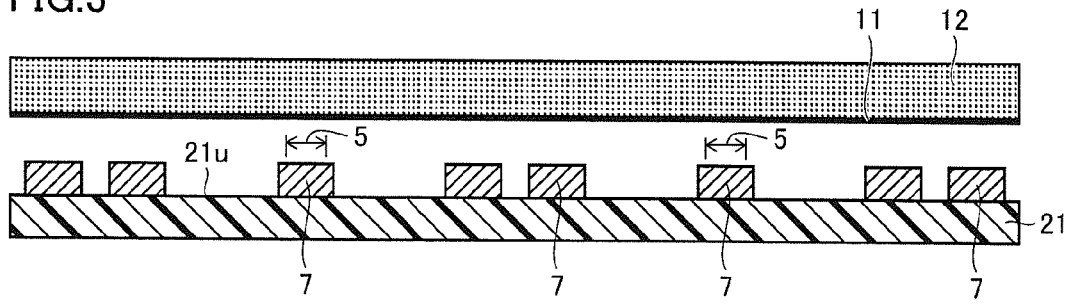
FIG. 3 illustrates a second step of a method for producing a resin multilayer board according to a preferred embodiment of the present invention.
Figure 4:
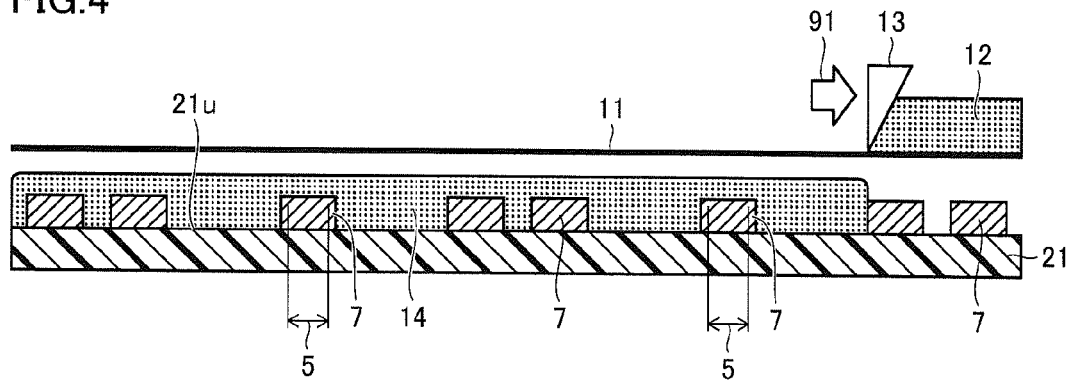
FIG. 4 illustrates a third step of a method for producing a resin multilayer board according to a preferred embodiment of the present invention.
Figure 5:
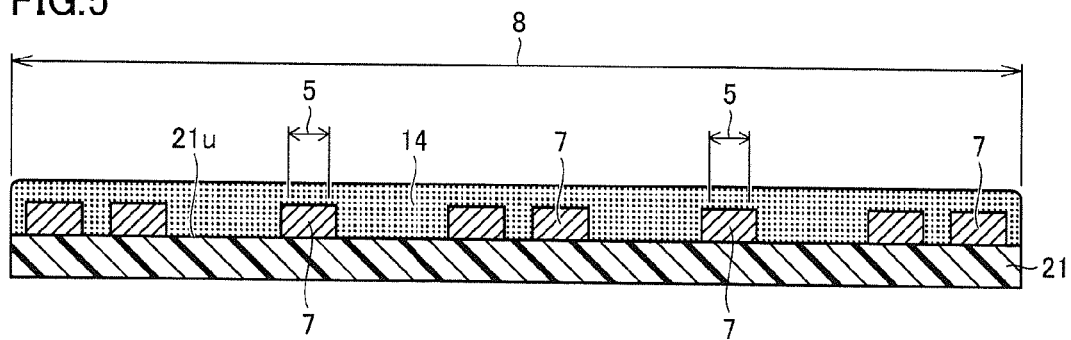
FIG. 5 illustrates a fourth step of a method for producing a resin multilayer board according to a preferred embodiment of the present invention.

A screen plate 11 is positioned as shown in FIG. 3. Paste 12 is provided at the opposite side of the screen plate 11. The paste 12 includes liquid crystal polymer powder and a dispersion medium. In FIG. 3, the screen plate 11 including the paste 12 provided on one surface thereof is positioned so as to overlap the main surface 21u of the first resin layer 21. As the step S2, as shown in FIG. 4, screen printing is preferably performed by moving a squeegee 13 in the direction of an arrow 91. In this manner, as shown in FIG. 5, a paint layer 14 covering a second region 8 of the main surface 21u is formed. The second region 8 also entirely covers the one or more conductor patterns 7. In the present preferred embodiment, the second region 8 preferably includes all of a plurality of first regions 5 that are present. In the example shown in FIG. 5, the entirety of the main surface 21u is the second region 8, however, in reality, the second region 8 is not necessarily the entirety of the main surface 21u. The second region 8 may be a portion of the main surface 21u. At this point in time, the conductor patterns 7 including the first regions 5 are also covered with the paint layer 14.

Figure 6:
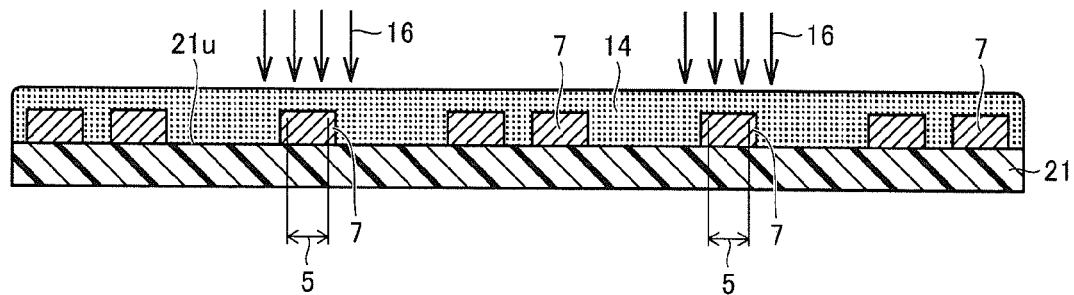
FIG. 6 illustrates a fifth step of a method for producing a resin multilayer board according to a preferred embodiment of the present invention.

As the step S3, laser processing is performed on the paint layer 14. That is, a laser beam 16 is applied as shown in FIG. 6. Accordingly, cavities 3 are formed in the paint layer 14 such that at least the first regions 5 of the one or more conductor patterns 7 are exposed. As a result of performing laser processing, a structure shown in FIG. 7 is obtained.

Figure 7:
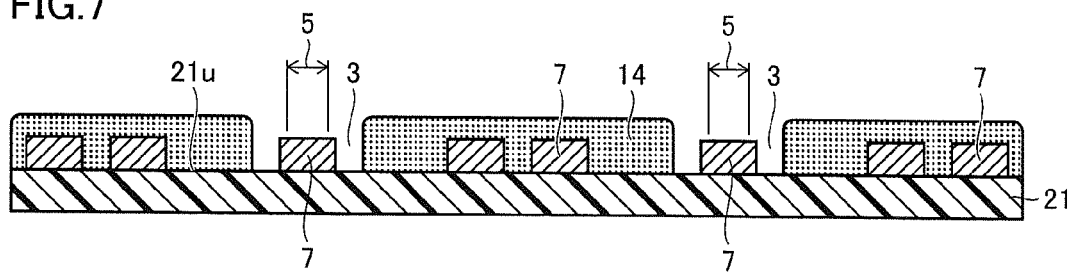
FIG. 7 illustrates a sixth step of a method for producing a resin multilayer board according to a preferred embodiment of the present invention.
Figure 8:
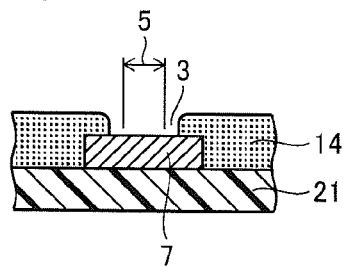
FIG. 8 illustrates an example in which a conductor pattern is wider than a cavity, as a modification of a method for producing a resin multilayer board according to a preferred embodiment of the present invention.

In the example shown in FIG. 7, the cavities 3 are wider than the conductor patterns 7. As a result, the entirety or substantially the entirety of one conductor pattern 7 is exposed within the cavity 3. Such a state may be obtained, but such a state is not necessary. For example, as shown in FIG. 8, the conductor pattern 7 may be wider than the cavity 3. In the cavity 3, the entirety or substantially the entirety of the first region 5 only needs to be exposed. For example, a $CO_2$ laser may be used for laser processing. When laser processing is used to form a cavity in the paint layer, a laser that is the same as that used to form a via hole for a conductor via 6 in the resin layer may preferably be used.

Figure 9:
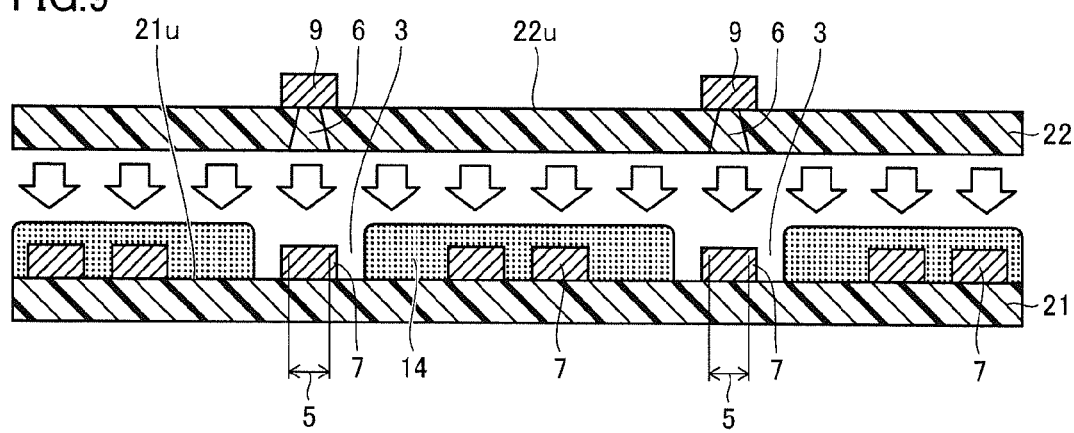
FIG. 9 illustrates a seventh step of a method for producing a resin multilayer board according to a preferred embodiment of the present invention.

As the step S4, a second resin layer 22 including conductor vias 6 is stacked on the first resin layer 21 after the step S of forming the cavities 3, as shown in FIG. 9. At this time, the second resin layer 22 is stacked such that the conductor vias 6 overlap the first regions 5. The second resin layer 22 includes a main surface 22u. Conductor patterns 9 are formed on the main surface 22u. The conductor patterns 9 are disposed so as to cover a portion of the main surface 22u. The main surface 22u is the surface of the second resin layer 22 at the side opposite to the first resin layer 21. The conductor vias 6 are connected to the conductor patterns 9 and penetrate the second resin layer 22. The conductor vias 6 are exposed in the surface of the second resin layer 22 at the side opposite to the main surface 22u.

Figure 10:
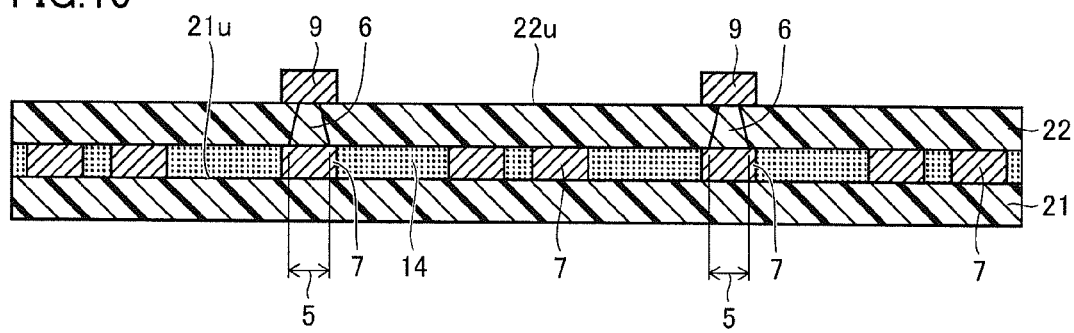
FIG. 10 illustrates an eighth step of a method for producing a resin multilayer board according to a preferred embodiment of the present invention.
Figure 11:
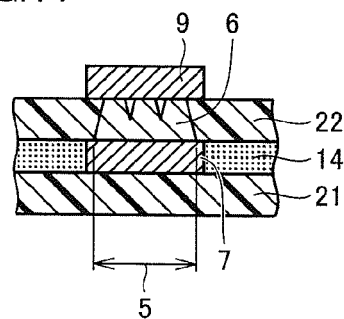
FIG. 11 illustrates an example in which inter-layer connection is made by a plurality of conductor vias aligned in a line, as a modification of a method for producing a resin multilayer board according to a preferred embodiment of the present invention.

When a result of the second resin layer 22 being stacked is schematically shown, the result is as shown in FIG. 10. More specifically, a state shown in FIG. 10 is not immediately caused when the second resin layer 22 is merely stacked. By a later-described thermal pressure-bonding step, the paint layer is moved, such that the state shown in FIG. 10 is obtained. Here, in FIG. 10, a state in which gaps are filled is shown for the convenience of explanation. By stacking and a thermal pressure-bonding step, the paint layer flows, so that the gaps in the cavities 3 formed by laser processing are filled by the paint layer flowing thereinto. The paint layer on the upper surfaces of the conductor patterns 7 is also pushed away by pressure applied during the thermal pressure-bonding step. The conductor vias 6 are in contact with the first regions 5 which are set on at least one of the one or more conductor patterns 7. Here, electrical connection is made by one conductor via 6 for one first region 5 for which inter-layer connection is made. The number of conductor vias 6 to be used for one first region 5 is not limited to one. As shown in FIG. 11, a plurality of conductor vias 6 may be disposed in one first region 5 so as to be aligned in a line.

Figure 12:
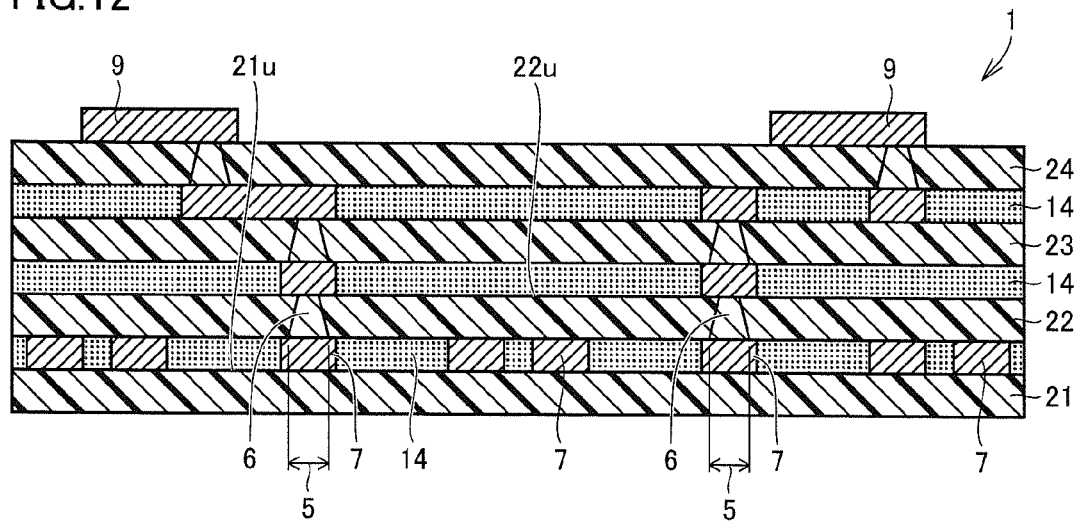
FIG. 12 illustrates a ninth step of a method for producing a resin multilayer board according to a preferred embodiment of the present invention.

In FIG. 10, a stack of the first resin layer 21 and the second resin layer 22 is shown. However, in reality, for example, as shown in FIG. 12, other resin layers 23 and 24 may be stacked as required. In this manner, a multilayer body 1 is obtained.

Figure 13:
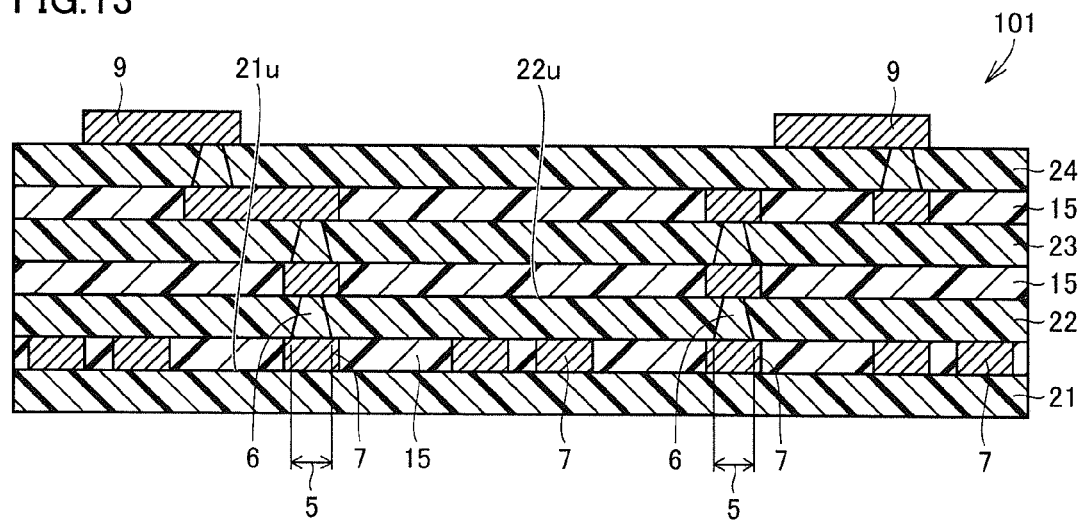
FIG. 13 illustrates a tenth step of the method for producing a resin multilayer board according to a preferred embodiment of the present invention.

As the thermal pressure-bonding step S5, thermal pressure-bonding is performed by applying pressure and heat to the multilayer body 1. The multilayer body 1 includes the stack of the second resin layer 22 on the first resin layer 21. Accordingly, as shown in FIG. 13, the conductor vias 6 and the conductor patterns 7 in the first regions 5 are connected to each other, and a resin multilayer board 101 including a layer 15 obtained by curing the paint layer is obtained.

In the present preferred embodiment, after a paint layer is formed in a wide region, cavities for inter-layer connection are formed in the paint layer. Thus, high accuracy is not necessary when forming the paint layer. For example, a paint layer may be formed on the entirety or substantially the entirety of the main surface of the first resin layer. The minimum diameters of the cavities are determined not by printing technique such as screen printing, but by the boring technique, such as laser processing, for example. For example, in reality, with screen printing, when the diameter of a conductor via for inter-layer connection is about 100 μm, the diameter of a cavity needs to be equal to or greater than about 900 μm, which is much larger than the diameter of the conductor via, due to printing haziness, blur, other factors. However, with laser processing, it is possible to accurately form a cavity having a smaller diameter. Therefore, patterns of a paint layer are formed so as to be opened with an appropriate size at locations at which inter-layer electrical connections are desired, so that insufficiency in thickness is eliminated and it is possible to obtain a flat resin multilayer board.

Through experimentation, it has been confirmed that, in the case of forming a cavity in a paint layer by laser processing, for example, even when the diameter of the cavity is about 360 μm, it is possible to effectively make electrical connection via a conductor via. This will be described below in detail.

In the present preferred embodiment, it is possible to reduce or minimize the diameter of the cavity to be formed in the paint layer which compensates for a level difference. Thus, it is possible to reduce a region in which it is impossible to compensate for a level difference. In the present preferred embodiment, the necessity to retain the shape of the paint layer for a long period of time is eliminated. Thus, it is not necessary to use a dispersion medium having a high viscosity when forming the paint layer, and it is possible to use a dispersion medium that is able to be dried at a low temperature. For example, when drying is performed at about 130° C., since this temperature is lower than the heat-resistant temperature of the resin layer, damage to the resin layer due to heating for drying is prevented.

In the present preferred embodiment, the example in which screen printing is performed in the step S2 of forming the paint layer, has been described. However, a technique used for forming the paint layer in the step S2 may be metal mask printing or coating method, instead of screen printing.

As described in the present preferred embodiment, at the point in time when the step S2 of forming the paint layer 14 ends, the paint layer 14 is thicker than the conductor patterns 7 including the first regions 5, and, at the point in time when the thermal pressure-bonding step S5 ends, the thickness of the paint layer 14 is preferably equal to or substantially equal to the thicknesses of the conductor patterns 7 including the first regions 5. Accordingly, it is possible to obtain a flat resin multilayer board. Even when pressure and heat are applied to the conductor patterns 7, the thicknesses of the conductor patterns 7 do not significantly change, but, when pressure and heat are applied to the paint layer 14, the thickness of the paint layer 14 decreases for reasons, such as evaporation of the dispersion medium and compression of the liquid crystal polymer powder. Therefore, the initial thickness of the paint layer 14 is preferably thicker than those of the conductor patterns 7, in order to make the thickness of the pain layer 14 equal to or substantially equal to the thicknesses of the conductor patterns 7 including the first regions 5 at the point in time when the step S5 ends.

As described in the present preferred embodiment, at the point in time when the step S3 of forming the cavity ends, the entirety or substantially the entirety of each conductor pattern 7 including the first region 5 is preferably exposed in the cavity 3. Accordingly, it is possible to reduce the probability that the component of the paint layer 14 covers the upper surface of the conductor pattern 7 so as to cover the first region 5.

The paste preferably includes a fibrillated liquid crystal polymer powder. When the fibrillated liquid crystal polymer (LCP) powder is included as described above in producing the paste, for example, the paste easily passes through a screen printing mesh. In addition, when the fibrillated liquid crystal polymer powder is included as described above, it is possible to easily increase the viscosity of the paste. In addition, changes in the thickness of the fibrillated liquid crystal polymer powder due to compression is large as compared to that of spherical or particulate liquid crystal polymer powder, for example. Thus, even when a paint is applied thick, the thickness of the paint layer 14 is easily equal to or substantially equal to the thicknesses of the conductor patterns 7 including the first regions 5 at the point in time when the thermal pressure-bonding step S5 ends.

The influence of the paint layer around the cavity on electrical connection through the conductor via will be described in detail.

Figure 14:
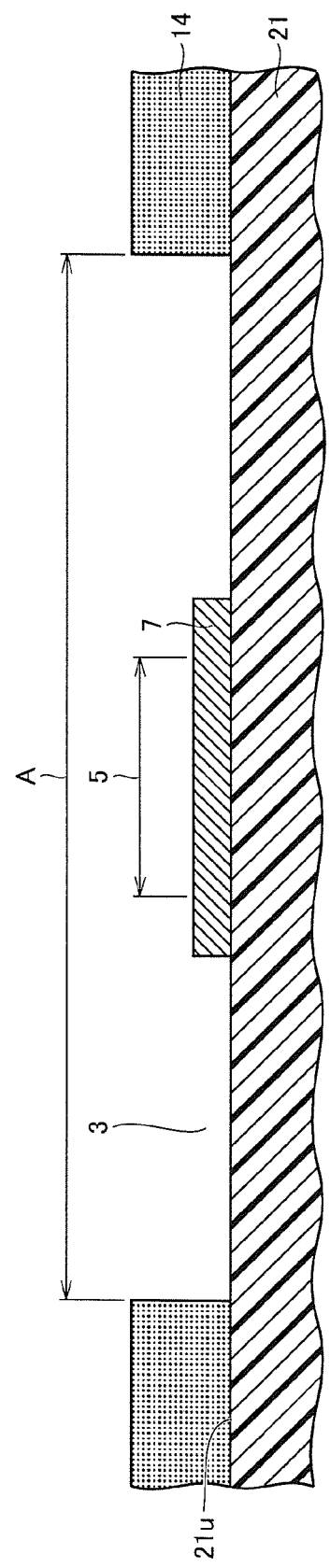
FIG. 14 is a first explanatory diagram regarding blur occurring at a cavity of a paint layer.
Figure 15:
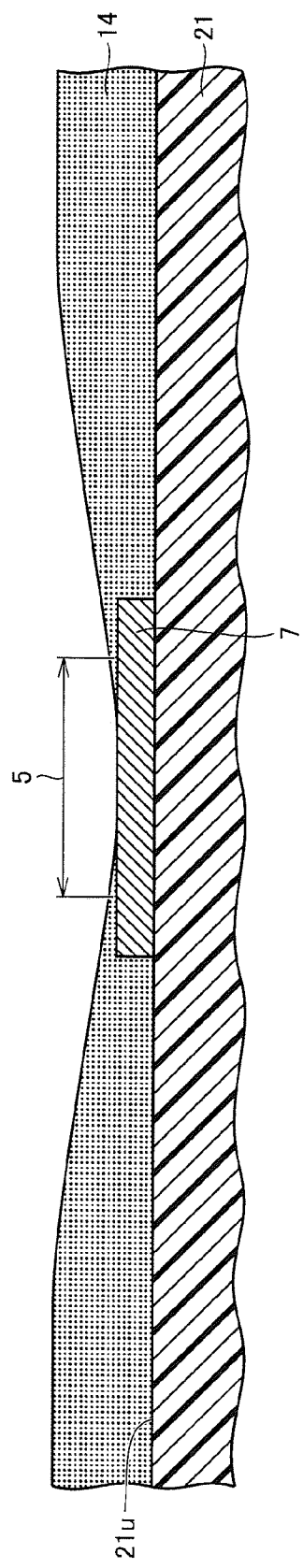
FIG. 15 is a second explanatory diagram regarding blur occurring the cavity of the paint layer.

As shown in FIG. 14, the conductor pattern 7 is disposed on the main surface 21u of the first resin layer 21. The first region 5 that is to be connected to a conductor via is set on a portion of the upper surface of the conductor pattern 7. The paint layer 14 is formed so as to cover a major portion of the main surface 21u. The diameter of the cavity 3 provided in the paint layer 14 is set to A to expose an area near the first region 5 of the conductor pattern 7. When the cavity 3 of the paint layer 14 is formed, for example, by screen printing, the paint layer 14 around the cavity 3 tends to collapse toward the inside of the cavity 3 as shown in FIG. 15. Such a collapse is viewed as a blur. The collapsing paint may move onto the upper surface of the conductor pattern 7, and the paint may reach the inside of the first region 5 of the upper surface of the conductor pattern 7. Since the first region 5 is a region to which the conductor via 6 of the second resin layer 22 is to be connected from above, if the paint covers the upper surface of the conductor pattern 7 within this region, the paint is positioned below the conductor via 6 at the time of connection of the conductor via 6. In such a case, electrical connection by the conductor via 6 is provided in an area smaller than the originally intended area. Alternatively, if the degree to which the paint covers the upper surface of the conductor pattern 7 is significantly high, a situation in which electrical connection is not made between the conductor via 6 and the conductor pattern 7 may arise.

An experiment was conducted in which cavities 3 having several different sizes were formed by each of screen printing and laser processing, a second resin layer including conductor vias 6 was layered from above, and a connection state between each conductor via 6 and each conductor pattern 7 was investigated.

Figure 16:
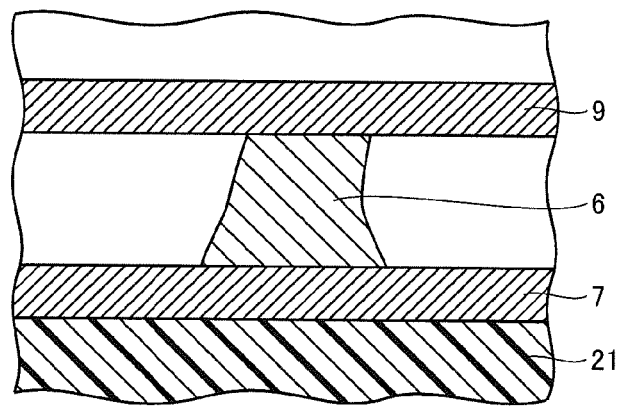
FIG. 16 is a cross-sectional view in an example in which a cavity is formed by screen printing and A=about 900 μm.

In the case in which the method for forming the cavity 3 was screen printing and A=about 900 μm, a state shown in FIG. 16 was obtained. The lower surface of the conductor via 6 is properly connected to the conductor pattern 7. The same applied to the case in which the method for forming the cavity 3 was screen printing and A=about 1000 μm.

Figure 17:
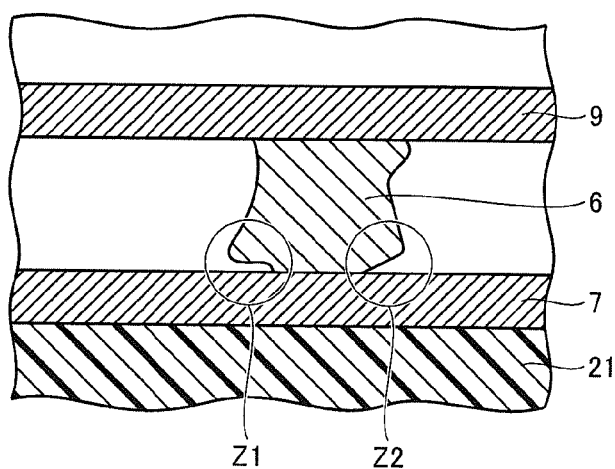
FIG. 17 is a cross-sectional view in an example in which a cavity is formed by screen printing and A=about 800 μm.

In the case in which the method for forming the cavity 3 was screen printing and A=about 800 μm, a state shown in FIG. 17 was obtained. That is, as seen in a portion Z1 and a portion Z2, a state was obtained in which the collapsing paint or the flowing paint during thermal pressure-bonding entered between the lower surface of the conductor via 6 and the upper surface of the conductor pattern 7. In the case in which the method for forming the cavity 3 was screen printing and A=about 700 μm, the entry of the paint became further significant, and a state was obtained in which the entire lower surface of the conductor via 6 was separated from the conductor pattern 7 by the paint.

Figure 18:
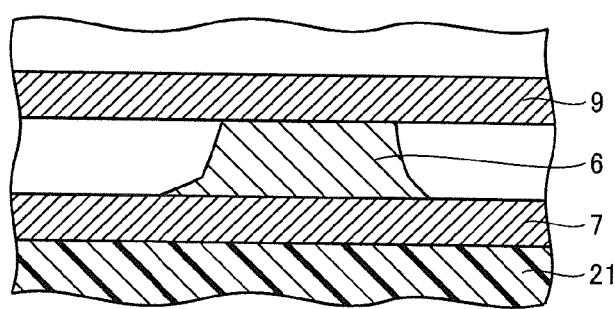
FIG. 18 is a cross-sectional view in an example in which a cavity is formed by laser processing and A=about 360 μm.

Next, in the case in which the method for forming the cavity 3 was laser processing and A=about 360 μm, a case shown in FIG. 18 was obtained. That is, the lower surface of the conductor via 6 is properly connected to the conductor pattern 7. The same applied to the case in which the method for forming the cavity 3 was laser processing and A=about 440 μm.

From these results, it was confirmed that, in the case of forming a cavity 3 by screen printing, when the diameter A of the cavity 3 is equal to or less than about 800 μm, connection of the conductor via 6 fails due to entry of the paint, but, in the case of forming a cavity 3 by laser processing, even when the diameter A of the cavity 3 is about 360 μm, connection of the conductor via 6 is securely made. In the case of screen printing, the occurrence of positional displacement of the screen plate or the occurrence of printing haziness, blur, or other factors is not avoidable, and, in the case in which the diameter A of the cavity is equal to or less than about 800 μm, entry of the paint due to these causes occurs. On the other hand, in the case of laser processing, the above-described problems do not arise. Thus, even when the diameter A of the cavity 3 is about 360 μm, it is possible to securely make connection of the conductor via 6.

In each preferred embodiment described above, for the convenience of explanation, the example in which each step of the production method is performed on a resin sheet having a size corresponding to one resin multilayer board, has been described. However, each step may be collectively performed on a resin sheet having a large size corresponding to a plurality of resin multilayer boards. In this case, after each step of the production method is performed on the resin sheet having a large size, the resultant product is divided into a size corresponding to an individual resin multilayer board, such that it is possible to efficiently obtain a plurality of resin multilayer boards.

A plurality of the preferred embodiments described above may be combined as appropriate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for producing a resin multilayer board, comprising:
    preparing a first resin layer that includes a liquid crystal polymer as a main material, a main surface, and one or more conductor patterns disposed on the main surface, the one or more conductor patterns including a conductor pattern, wherein the conductor pattern including a first region that is to be connected to a conductor via;
    forming a paint layer by applying a paste including a liquid crystal polymer powder to a second region entirely covering the one or more conductor patterns on the main surface, wherein the paint layer has an initial thickness that is greater than a thickness of the one or more conductor patterns in order to provide a sufficient thickness to obtain the resin multilayer board;
    forming a cavity in the paint layer such that at least the first region of the one or more conductor patterns is exposed, by performing laser processing on the paint layer;
    stacking a second resin layer including the conductor via, on the first resin layer after the cavity is formed, such that the conductor via overlaps the first region; and
    applying pressure and heat to a multilayer body including a stack of the second resin layer stacked on the first resin layer to perform thermal pressure-bonding to directly connect the conductor via to the conductor pattern in the first region and to obtain the resin multilayer board with a flat surface and including a layer obtained by curing the paint layer.

2. The method for producing the resin multilayer board according to claim 1, wherein
at a point in time when forming the paint layer ends, the paint layer is thicker than the conductor pattern including the first region; and
at a point in time when the thermal pressure-bonding ends, a thickness of the paint layer is equal to a thickness of the conductor pattern including the first region.

3. The method for producing the resin multilayer board according to claim 1, wherein, at a point in time when forming the cavity ends, an entirety of the conductor pattern including the first region is exposed in the cavity.

4. The method for producing the resin multilayer board according to claim 1, wherein the paste includes a fibrillated liquid crystal polymer powder.

5. The method for producing the resin multilayer board according to claim 1, wherein, at a point in time when forming the cavity ends, the conductor pattern is wider than the cavity.

6. The method for producing the resin multilayer board according to claim 1, wherein, at a point in time when forming the cavity ends, the cavity is wider than the conductor pattern.

7. The method for producing the resin multilayer board according to claim 1, wherein the paint layer is formed by screen printing.

8. The method for producing the resin multilayer board according to claim 1, wherein a diameter of the cavity is 360 µm or greater.

* * * * *